(12) United States Patent
Beach

(10) Patent No.: US 7,541,137 B2
(45) Date of Patent: Jun. 2, 2009

(54) RESIST RESOLUTION USING ANISOTROPIC ACID DIFFUSION

(76) Inventor: James V. Beach, 1501 Resaca Blvd., Austin, TX (US) 78738

( * ) Notice: Subject to any disclaimer, the term of this patent is extended or adjusted under 35 U.S.C. 154(b) by 367 days.

(21) Appl. No.: 11/311,930

(22) Filed: Dec. 19, 2005

(65) Prior Publication Data
US 2007/0141517 A1  Jun. 21, 2007

(51) Int. Cl.
*G03F 7/26* (2006.01)
(52) U.S. Cl. .................. 430/322; 430/325; 430/330
(58) Field of Classification Search ............ 430/311, 430/322, 325, 330
See application file for complete search history.

(56) References Cited

U.S. PATENT DOCUMENTS

| | | | |
|---|---|---|---|
| 6,686,132 B2 | 1/2003 | Neureuther et al. | 430/323 |
| 2003/0008246 A1 | 1/2003 | Cheng et al. | 430/323 |
| 2005/0074706 A1 | 4/2005 | Bristol et al. | 430/327 |

FOREIGN PATENT DOCUMENTS

WO   WO 2004/057425   7/2004
WO   WO 2005038527   4/2005

OTHER PUBLICATIONS

Cheng et al., "ArF imaging modeling by using resist sijulation and pattern matching," *Proc. SPIE*, 436:309-318, 2001.
Cheng et al., "Enhancement of resist resolution and sensitivity via applied electric field," *J. Vac. Sci. Technol. B*, 18(6):3318-3322, 2000.
Cheng, Mosong, "Comprehensive model for projection photolithography: rigorous, fast and novel processing," *UMI Dissertation Services*, University of California: Berkley, 2002.
Croffie et al., "Modeling chemically amplified resists for 193-nm lithography," *Proc. SPIE*, 3999:171-180, 2000.
Croffie et al., "Moving boundary transport model for acid diffusion in chemically amplified resists," *J. Vac. Sci. Technol.*, 17:3339-3344, 1999.
Yuan et al., "Three-dimensional postexposed bake modeling and its applications," *Proc SPIE*, 4345:992-1000, 2001.
PCT International Search Report, issued in International Application No. PCT/US2006/062308, dated Oct. 1, 2007.

*Primary Examiner*—Kathleen Duda
(74) *Attorney, Agent, or Firm*—Fulbright & Jaworski LLP

(57) ABSTRACT

Methods for increasing the resolution capability and line edge roughness of resists, including chemically amplified resists are disclosed. In order to improve upon the resolution, dipolar species may be coupled to a photoacid group and/or added to the resist, where the dipolar species may influence the direction of acid diffusion. An electric field may be applied to a post-exposure bake process and/or a soft bake process and the resist layer is developed.

5 Claims, 7 Drawing Sheets

RESIST RESOLUTION USING ANISOTROPIC ACID DIFFUSION

BACKGROUND OF THE INVENTION

1. Field of the Invention

The present invention relates generally to characterizing semiconductor materials. More particularly, the present disclosure involves improving resist resolution by using a dipolar group coupled to an anion of a photo-acid generator of the resist to force anisotropic acid diffusion process during post-exposure bake.

2. Description of Related Art

A chemically amplified (CA) resist functions through the use of a photo-acid generator (PAG) that reacts with light to create a strong acid. Examples of PAGs used in photoresist layers, include triphenylsulfonium perfluorobutylsulfonate (FIG. 1A), bis(p-tert-butylphenyl)iodoium trifluoromethanesulfonate (FIG. 1B), and 5-norbornene-2,3-dicarboximidyl trifluoromethanesulfonate (FIG. 1C). A PAG has two parts: a chromophore, which interacts with the light and creates a strong acid, and an ion, which associates with but does not quench the acid. The strong acid and spectator ion diffuses through the resist polymer and catalyzes approximately 100 chemical reactions before the acid is neutralized, changing the solubility of the resist polymer. In this way, one photon of light creates approximately 100 chemical reactions, thus the term "chemical amplification." As deep ultraviolet (DUV) 193 nanometers and extreme ultraviolet (EUV) light sources are relatively dim, CA resists have become a necessary component to viable production processes.

In order for multiple reactions to be catalyzed, it is necessary for the acid created in the exposure process to diffuse. This diffusion has been calculated to be about 20-50 nanometers depending on the resist and the process conditions. Thus, CA resists have a resolution limit of about 40 nanometers (half-pitch). The 2004 International Technology Roadmap for Semiconductors (ITRS) calls for 35 nm gates in resist and 45 nm half-pitch lines in 2010. These features are anticipated to shrink 25 nm and 32 nm, respectively three years later. It is currently proposed that 193 nm immersion lithography will handle the 45 nm node in 2010 and EUV will be to production tool of choice to print at the 32 nm node in 2013. Both these systems will use chemically amplified resists in some form.

In general, the acid diffusion needs to be controlled in order to refine the process for the smaller device sizes predicted. Currently, acid diffusion can be controlled by lowering post-exposure bake (PEB) temperatures, use of large PAG molecules, and the addition of a base (acid quencher) to the photoresist. However, these methods slows photo speed, and thus can negate the advantage of the high speed of CA resists (dose-to-size of a line/space pattern <30 mj/cm$^2$). Moreover, vertical acid diffusion is necessary to smooth out standing waves that are naturally produced by the exposure tool, as shown in FIG. 2A. Current production methods rely solely on a isotropic (non-directional) processes to control acid diffusion such as those mentioned above in this paragraph (FIG. 2B).

Any shortcoming mentioned above is not intended to be exhaustive, but rather is among many that tends to impair the effectiveness of previously known techniques for characterizing substrates; however, shortcomings mentioned here are sufficient to demonstrate that the methodologies appearing in the art have not been satisfactory and that a significant need exists for the techniques described and claimed in this disclosure.

BRIEF DESCRIPTION OF THE DRAWINGS

The following drawings form part of the present specification and are included to further demonstrate certain aspects of the present invention. The figures are examples only. They do not limit the scope of the invention.

DESCRIPTION OF ILLUSTRATIVE EMBODIMENTS

The disclosure and the various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only and not by way of limitation. Various substitutions, modifications, additions, and/or rearrangements within the spirit and/or scope of the underlying inventive concept will become apparent to those skilled in the art from this disclosure.

The present disclosure provides for improving the resolution of a photoresist layer by applying techniques commonly used with etches and implant processing. For example, etch and implant processes greatly improve their resolution by using an anisotropic process. By applying an electrical bias to the wafer, these processes direct chemical species, such as, but not limited, charged ions, to move in a vertical direct with minimal lateral motion. As such, according to embodiments of this disclosure, a similar technique may be used during the post-exposure baking (PEB) of a photoresist layer to take advantage of the photospeed of a chemically amplified resist layer and limit the image blur and line-edge roughness caused by lateral acid diffusion. In particular, the present disclosure provides for coupling an anion to a dipolar species to further limit the lateral acid diffusion.

Figure 1B:
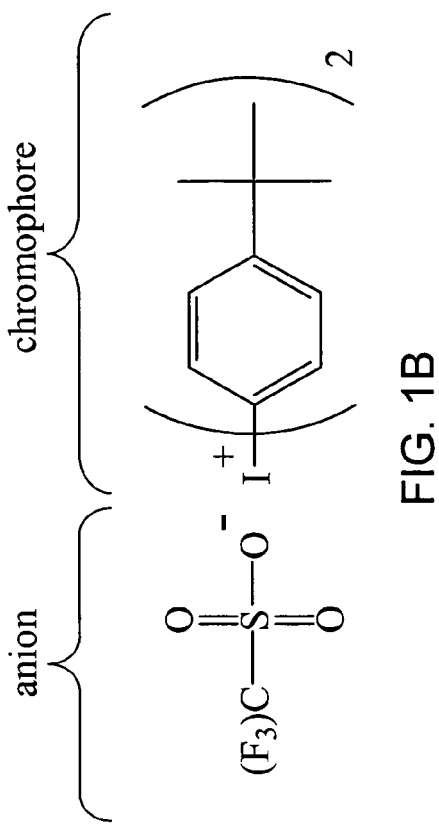
FIGS. 1A-1C are examples of common PAGs used in photoresist.
Figure 1A:
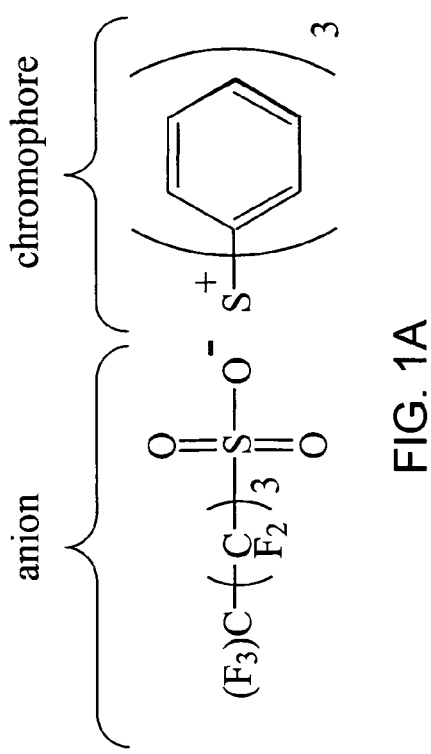
Figure 1C:
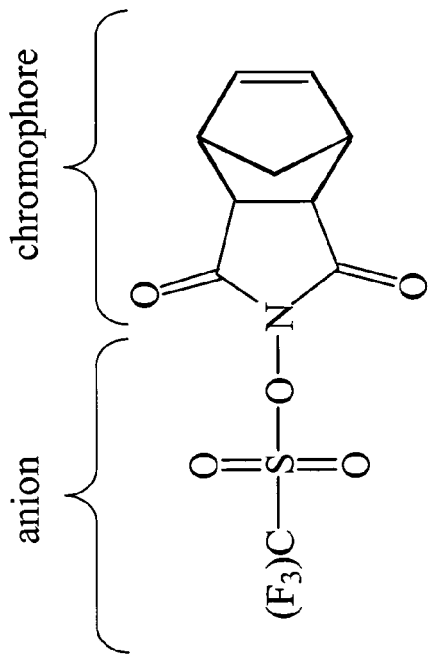
Figure 2B:
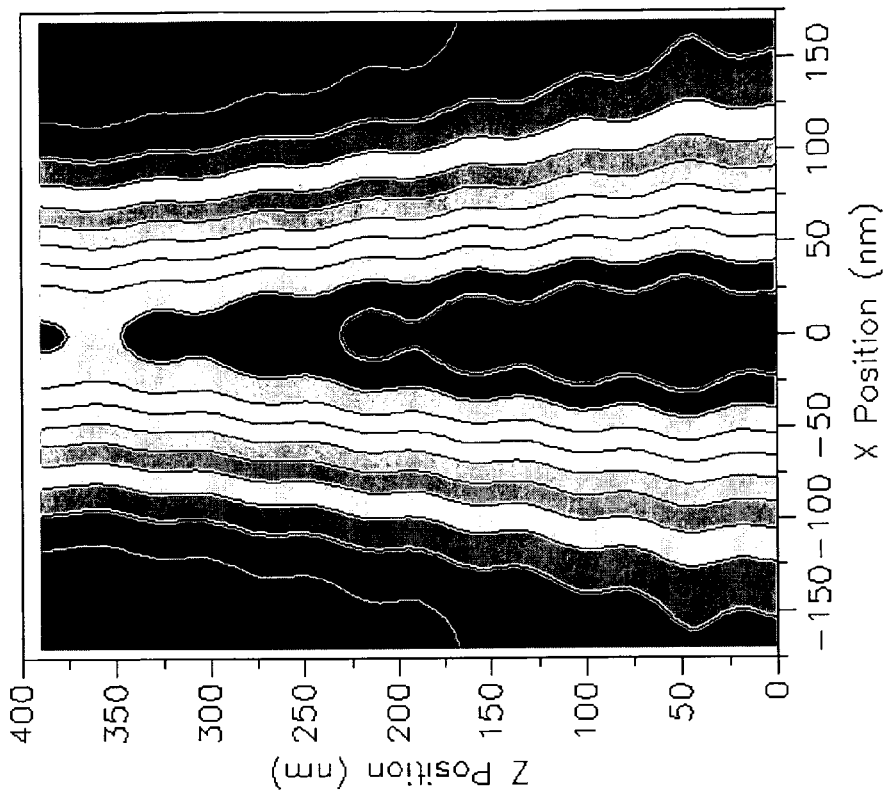
FIG. 2B are the standing waves of FIG. 2B after isotropic post-exposure bake.
Figure 2A:
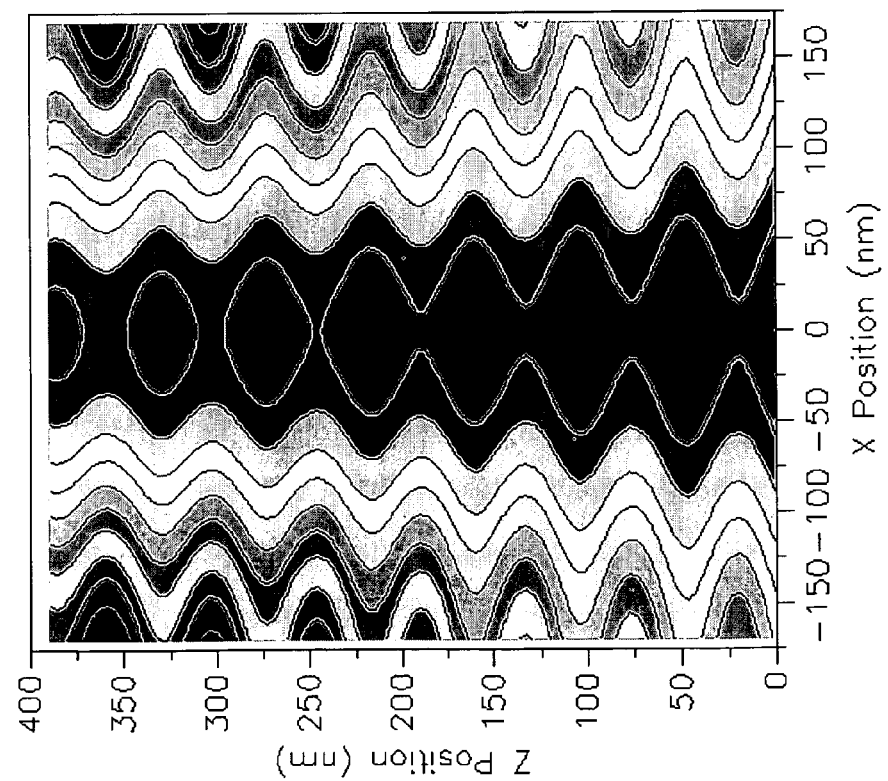
FIG. 2A are standing waves produced by an exposure tool.
Figure 4:
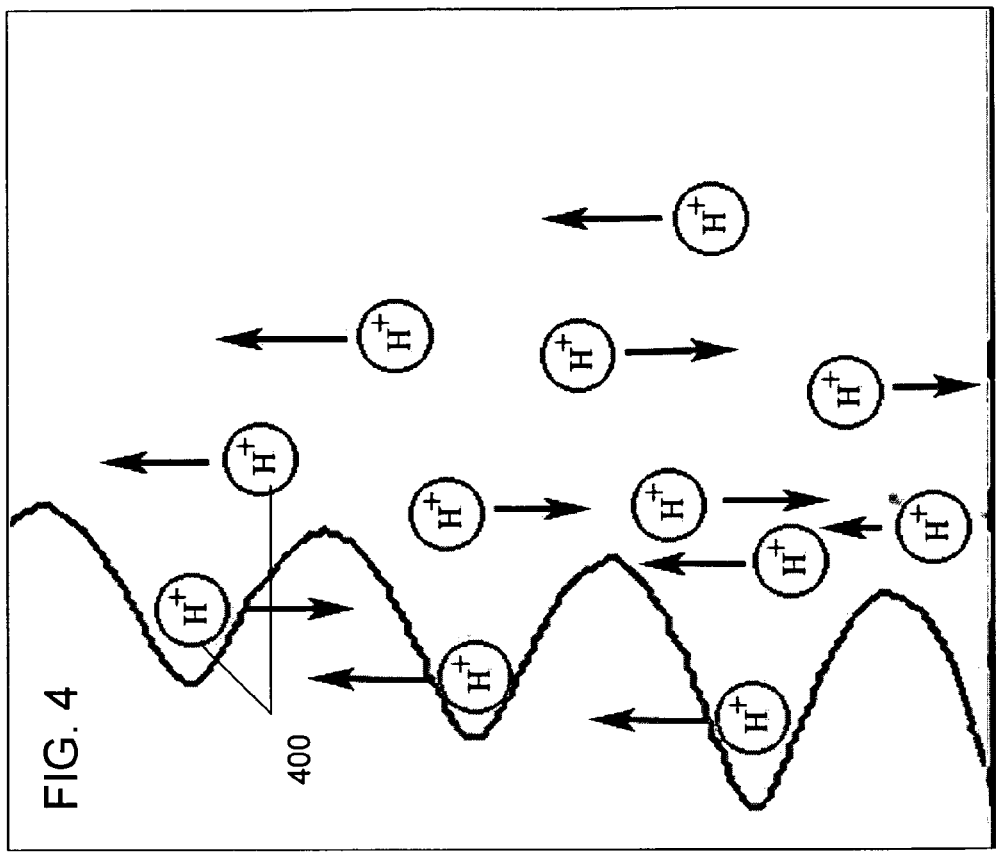
FIG. 4 shows anisotropic movement of photo-acid in exposed resist.
Figure 3:
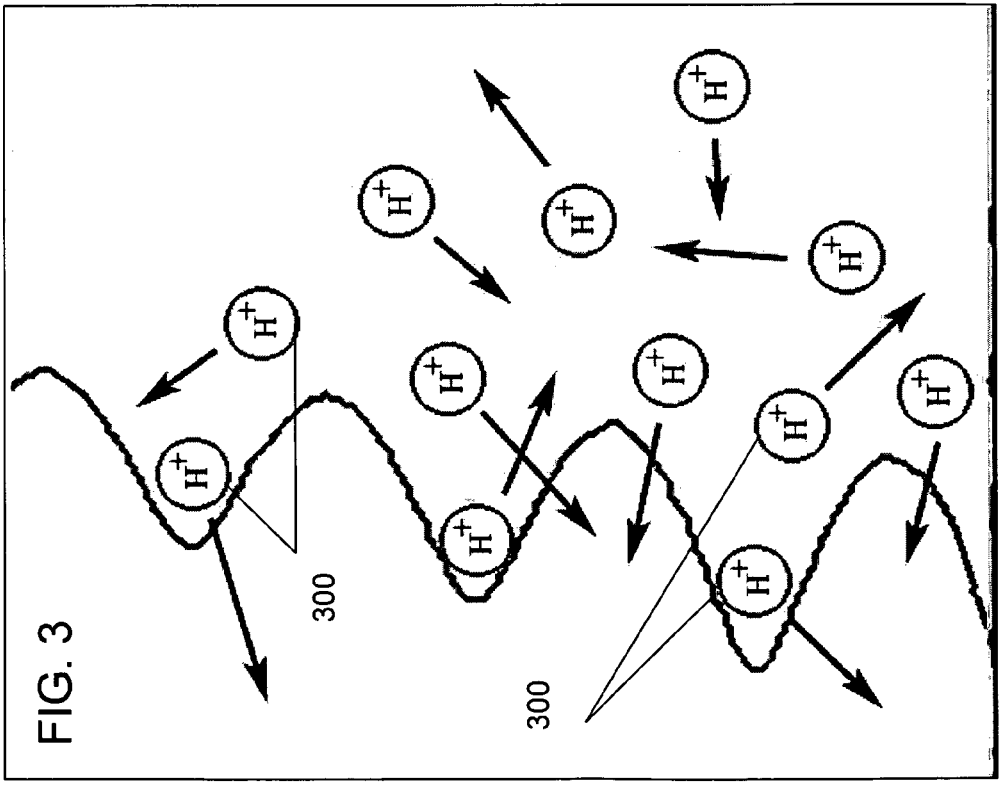
FIG. 3 shows isotropic movement of photo-acid in exposed resist.

Movements of photoacid 300 are generally random and thus, may cause the edges defined by an exposure to blur, as seen in FIG. 3. Diffusion in the horizontal direction causes a loss of line-edge definition which causes line-edge roughness and loss of resolution. Trying to reduce the image blur by simply limiting distance the acid travels can reduce the resist's photospeed and increase standing waves in the profile. Referring to FIG. 4, by limiting the direction photoacid 400 travels but not the length of the acid diffusion, the line edge is sharply defined and the standing waves are removed without sacrificing photospeed.

One technique to control diffusion uses an electric field to directly influence the motion of the acid. Electric fields have been shown to have some influence on the acid diffusion in photoresists. However, use of an electric field alone does not hinder the lateral acid diffusion.

Figure 5:
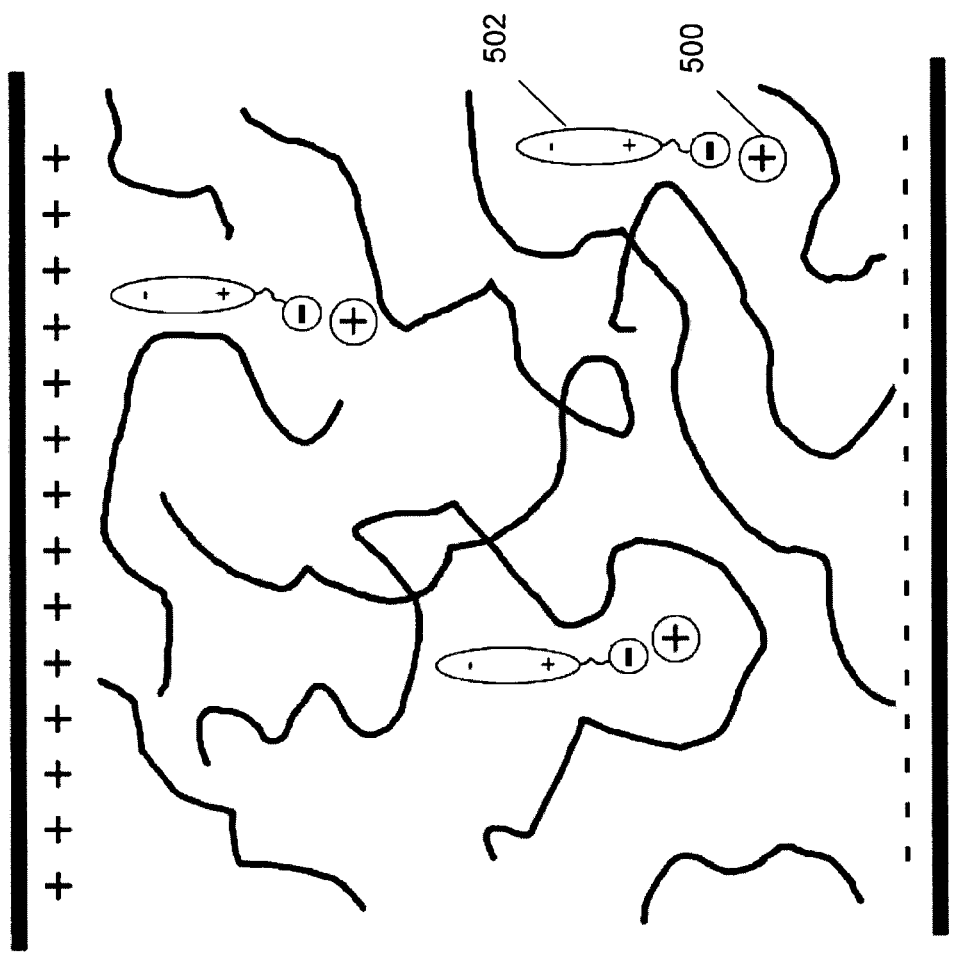
FIG. 5 is a block diagram of a photo-acid generator coupled to a dipolar group, in accordance to embodiments of the disclosure.
Figure 6C:
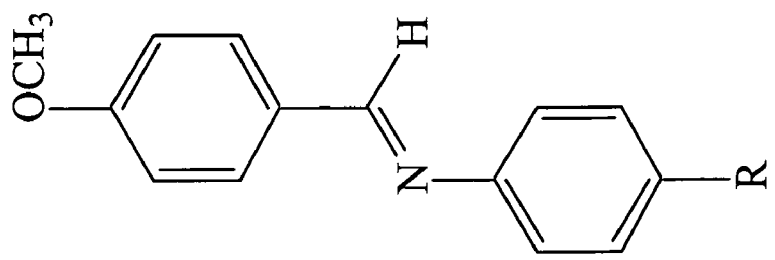
FIGS. 6A-6C are examples of liquid crystal based dipolar groups, in accordance to embodiments of the invention.
Figure 6B:
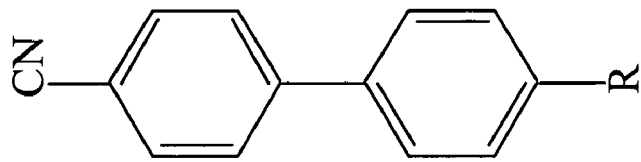
Figure 6A:
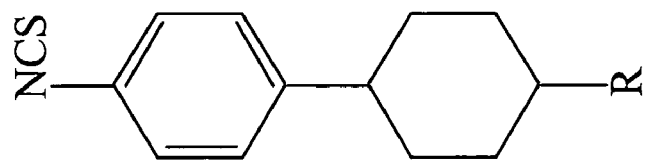
Figure 8:
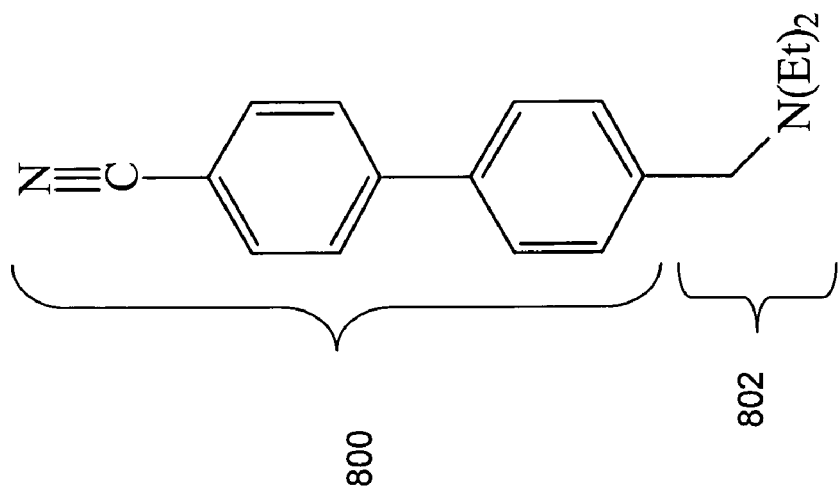
FIG. 8 is a chemical structure of an example quencher with an attached dipolar group, in accordance to embodiments of the disclosure.
Figure 7:
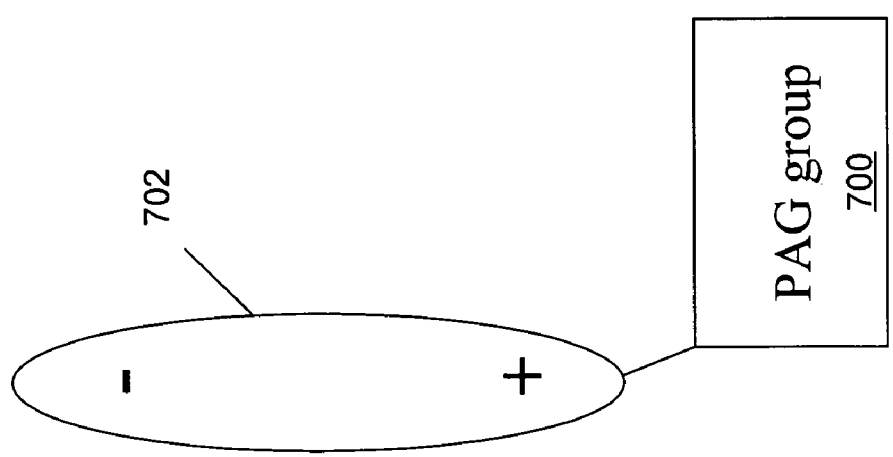
FIG. 7 is a general strategy and a specific chemical structure of an example dipolar group attached to a PAG, in accordance to embodiments of the disclosure.

In one embodiment, the influence of the external electric field may be increased if a bulky dipolar species 502 is coupled to anion 500 such that the electric field would attempt to orient the dipole perpendicular to the wafer, as shown in FIG. 5. Horizontal motion through the polymer matrix would require more energy than vertical motion as the dipole is less bulky when traveling along its axis and horizontal motion would torque the dipole out of alignment. A dipolar group 702, like those found on liquid crystals may be attached to standard PAG molecules 700, as shown in FIG. 7. Examples of a dipolar group include, without limitation, 1-isothiocyanato-4-(trans-cyclohexyl) benzene group (FIG. 6A), p-cyanobiphenyl group (FIG. 6B), and P-methoxy benzylidene p-aniline group (FIG. 6C). Any number of dipolar groups may be coupled to PAG molecules, such as, but not limited to, dipolar molecules that express liquid-crystal behavior. The dipolar groups may be selected such that a balance in solubility and stability of the resist solution may be attained. Other factors including, for example, transparency to the exposure radiation, efficiency of photoacid generation and acid diffusion performance in an electric field may also be considered. By attaching the dipolar group to the anion part of the PAG, the photoacid is restricted in lateral motion by its required association with the anion during the application of the external electronic field In other embodiments, a dipolar, rod-like quencher may be incorporated into the resist, as shown in FIG. 8. Base quenchers 802 may be added to photoresists to improve resist contrast and resist sensitivity to external poisoning. Isotropic base diffusion can influence resist performance in the same manner as isotropic acid diffusion accept that the base quenches PAG 800 rather than catalyzing the polymer deprotection. Moreover, quenchers 802 may be neutral in charge and, thus, would have minimal influences from the external electric field. Attaching dipolar groups to the quencher molecules hinders their lateral diffusion and contributes to a sharp line-edge definition in the resist. One of ordinary skill in the art can recognize that there are many possible combinations of dipolar groups and quenchers that may be used.

By providing a dipolar species to a PAG and/or the resist layer may further enhance the resolution of the resist layer. In one embodiment, the dipolar species may be coupled to anion of the PAG. Alternatively, the dipolar species may be an additive to the resist layer.

Figure 9:
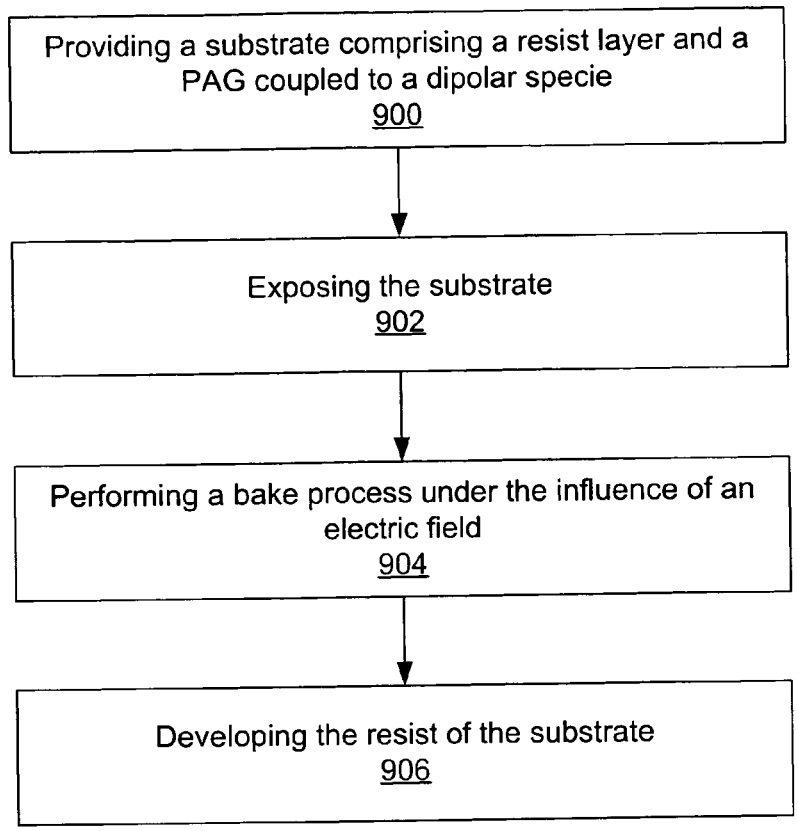
FIG. 9 is a flow chart of a method for generating a resist image on a substrate, in accordance to embodiments of the disclosure.

Referring to FIG. 9, a method for generating a resist image on a substrate is shown. In step 900, a substrate may be provided. The substrate may include a resist layer and a photoacid group coupled to a dipolar species such as a liquid crystal dipolar group or dipolar quencher. The dipolar species may be used to enhance the acid diffusion of the photoacid group.

Figure 10:
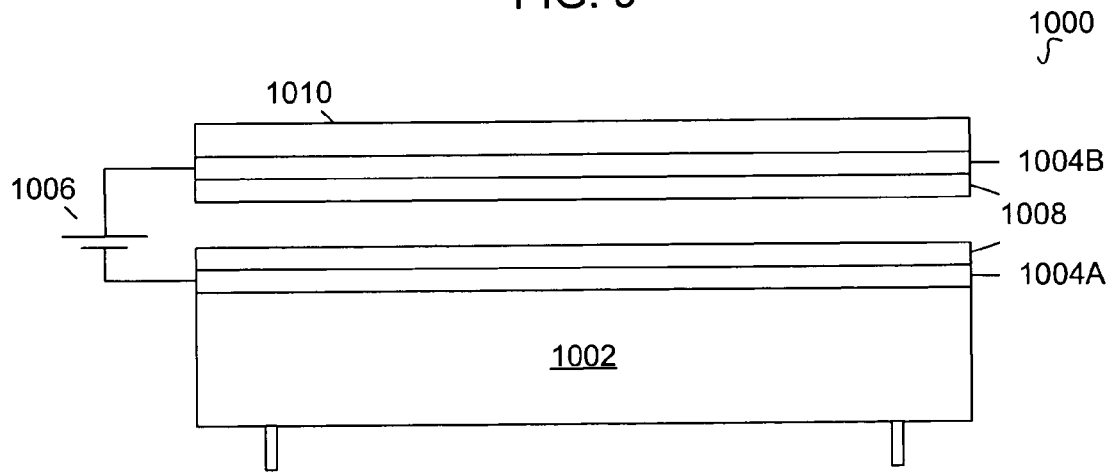
FIG. 10 is an apparatus for pre- or post-exposure baking under the influence of an electric field, in accordance to embodiments of the disclosure.

In step 902, the resist layer may be exposed to an predetermined pattern of the electromagnetic radiation source. After the exposure step, the substrate may be baked under the influence of an electric field (step 904). Referring to FIG. 10, an example of apparatus 1000 for baking the substrate is shown. In order to apply an electric field for post-applied and/or post-exposure bake steps, a modified bake plate may be required. In one respect, apparatus 1000 may include electrically conductive parallel plates 1004A and 1004B. In some embodiments, conductive parallel plates 1004A and 1004B may be designed for delivering a voltage on the order of tens of volts without arching. In one embodiment, second conductive plate 1004B may be set apart from first conductive plate 1004A by a fixed distance on the order of millimeters or tens of millimeters.

Conductive parallel plates 1004A and 1004B may be coupled to power source 1006. The direction of the electronic field applied by power source 1006 may be perpendicular to the hot plate surface, thus perpendicular to the wafer surface as it is being baked. In some embodiments, power source 1006 may be a DC power source (e.g., a battery). Alternatively, power source 1006 may be an AC power source. The temperature of the conductive plates may be controlled, if necessary, to manage a uniform temperature of the system during the bake process. The bake plate operates at a temperature range of about 80° C. to 200° C. Typical bake times for soft bake and post-exposure bake may be from about 30 seconds to 3 minutes.

First conductive parallel plate 1004A may also be coupled to a top surface of hot plate 1002 and placed directly below non-conducting surface 1008 (e.g., a ceramic surface) of hot plate 1002. Similarly, second conductive parallel plate 1004B may be coupled to non-conducting surface 1008 of heating element 1010.

Upon the completion of step 904, the image that was transferred during step 902 may be developed in step 906. Techniques for developing the image include, exposure to ultraviolet wavelengths or other techniques known in the art.

All of the methods and systems disclosed and claimed can be made and executed without undue experimentation in light of the present disclosure. While the methods of this invention have been described in terms of embodiments, it will be apparent to those of skill in the art that variations may be applied to the methods and in the steps or in the sequence of steps of the method described herein without departing from the concept, spirit and scope of the invention. All such similar substitutes and modifications apparent to those skilled in the art are deemed to be within the spirit, scope, and concept of the disclosure as defined by the appended claims.

The invention claimed is:

1. A method comprising:
providing a semiconductor material comprising a resist layer and a photoacid group coupled to a dipolar species for enhancing a resolution of the resist layer, the dipolar species comprising a dipolar quencher;
exposing the resist layer to an image;
performing a bake step under the influence of an electric field on the semiconductor material; and
developing the image on the resist layer.

2. A method comprising:
providing a semiconductor material comprising a resist layer and a photoacid group coupled to a dipolar species for enhancing a resolution of the resist layer, the dipolar species comprising a liquid crystal group;
exposing the resist layer to an image;

performing a bake step under the influence of an electric field on the semiconductor material; and developing the image on the resist layer.

3. The method of claim 2, the liquid crystal group being selected from the group consisting of a 1-isothiocyanato-4-(trans-cyclohexyl) benzene group, a p-cyanobiphenyl group, and a p-methoxy benzylidene p-aniline group.

4. A method comprising:

providing a semiconductor material comprising:

a resist layer comprising a dipolar species for enhancing the resolution of the resist layer, the dipolar species being selected from the group consisting of a quencher, a 1-isothiocyanato-4-(trans-cyclohexyl) benzene group, a p-cyanobiphenyl group, and a p-methoxy benzylidene p-aniline group; and a photoacid group;

exposing the resist layer to an image;

performing a bake step for orientating the dipolar species in a direction of acid diffusion;

performing a bake step under the influence of an electric field on the semiconductor material; and developing the image on the resist layer.

5. A method comprising:

providing a semiconductor material comprising:

a resist layer; and a photoacid group comprising a dipolar species coupled to an anion, the dipolar species being selected from the group consisting of a quencher, a 1-isothiocyanato-4-(trans-cyclohexyl) benzene group, a p-cyanobiphenyl group, and a p-methoxy benzylidene p-aniline group, where the dipolar species enhances the resolution of the resist layer;

exposing the resist layer to an image;

performing a bake step for orientating the dipolar species in a direction of acid diffusion;

performing a bake step under the influence of an electric field on the semiconductor material; and developing the image on the resist layer.

* * * * *